(12) United States Patent
Lindsey et al.

(10) Patent No.: US 7,808,245 B2
(45) Date of Patent: Oct. 5, 2010

(54) TESTING METHOD FOR A GROUND FAULT DETECTOR

(75) Inventors: Robert Wayne Lindsey, Washington, IL (US); Curtis Brian Johnson, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 158 days.

(21) Appl. No.: 11/905,264

(22) Filed: Sep. 28, 2007

(65) Prior Publication Data
US 2009/0085575 A1    Apr. 2, 2009

(51) Int. Cl.
G01R 31/14  (2006.01)
H01H 31/12  (2006.01)
H02H 3/00  (2006.01)

(52) U.S. Cl. .................. 324/510; 324/511; 324/551; 361/42

(58) Field of Classification Search ......... 324/509–511, 324/551; 361/42
See application file for complete search history.

(56) References Cited

U.S. PATENT DOCUMENTS

| | | | | |
|---|---|---|---|---|
| 4,177,420 | A | * | 12/1979 | Tripp .......................... 324/503 |
| 4,292,585 | A | | 9/1981 | Charette |
| 4,609,865 | A | | 9/1986 | Goodman et al. |
| 5,272,438 | A | | 12/1993 | Stumme |
| 5,534,364 | A | * | 7/1996 | Watanabe et al. ............. 429/61 |
| 5,642,052 | A | | 6/1997 | Earle |
| 5,652,526 | A | * | 7/1997 | Sullivan et al. ............. 324/772 |
| 5,796,636 | A | | 8/1998 | Andrews |
| 5,982,593 | A | | 11/1999 | Kimblin et al. |
| 6,052,265 | A | | 4/2000 | Zaretsky et al. |
| 6,313,642 | B1 | | 11/2001 | Brooks |
| 6,323,656 | B2 | | 11/2001 | Shoemaker |
| 6,421,214 | B1 | | 7/2002 | Packard et al. |
| 6,674,289 | B2 | | 1/2004 | Macbeth |
| 6,678,132 | B1 | * | 1/2004 | Carruthers et al. ............. 361/42 |
| 6,864,688 | B2 | * | 3/2005 | Beutelschiess et al. ...... 324/551 |
| 6,888,708 | B2 | | 5/2005 | Brungs et al. |
| 6,984,988 | B2 | * | 1/2006 | Yamamoto ................... 324/509 |
| 6,992,490 | B2 | * | 1/2006 | Nomoto et al. ............. 324/509 |
| 7,102,355 | B1 | | 9/2006 | Kumar |
| 2005/0001607 | A1 | | 1/2005 | Berland et al. |
| 2005/0036250 | A1 | * | 2/2005 | Asano .......................... 361/42 |
| 2006/0195733 | A1 | | 8/2006 | DeHaven |
| 2007/0146947 | A1 | | 6/2007 | Zhang et al. |
| 2009/0040666 | A1 | * | 2/2009 | Elms et al. .................... 361/42 |

OTHER PUBLICATIONS

U.S. Appl. No. 11/645,568, filed Dec. 27, 2006.
U.S. Appl. No. 11/589,831, filed Oct. 31, 2006.
U.S. Appl. No. 11/819,885, filed Jun. 29, 2007.
U.S. Appl. No. 11/882,242, filed Jul. 31, 2007.

* cited by examiner

Primary Examiner—Timothy J Doyle
(74) Attorney, Agent, or Firm—Finnegan, Henderson, Farabow, Garrett & Dunner LLC

(57) ABSTRACT

A testing system for a ground fault detection system of an electrical system of a machine is disclosed. The testing system has a low voltage power source, the low voltage power source capable of operation that is independent from a high voltage power source of the machine. The testing system also has a variable current source that is permanently connected to a positive voltage bus or to a negative voltage bus of the electrical system of the machine, where the machine operates self-sufficiently. The testing system also has a controller connected to the variable current source. The testing system also has an input device, where the input device is connected to the controller.

20 Claims, 1 Drawing Sheet

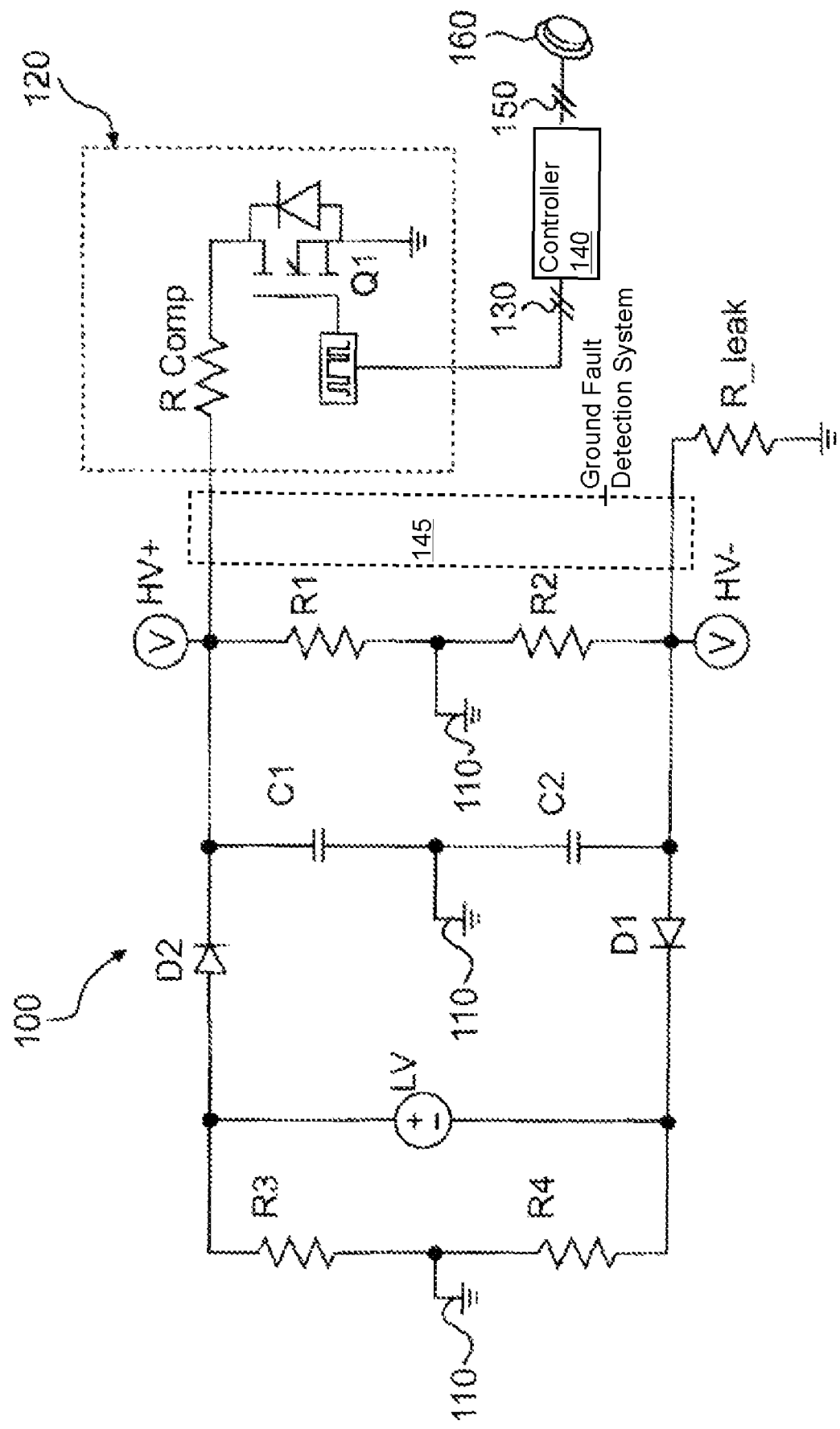

TESTING METHOD FOR A GROUND FAULT DETECTOR

TECHNICAL FIELD

The present disclosure is directed to a ground fault detection system and, more particularly, to a testing system for a ground fault detection system.

BACKGROUND

A high voltage DC power supply system is required for driving an electric machine that incorporates a high voltage electrical drive motor and electric auxiliaries. The integrity of the high voltage system is critical to the reliability of the machine. Typically, the machine frame is electrically insulated from the terminals or conductors of the high voltage power supply. Under normal working conditions, DC leakage currents on the order of microamps exist between the conductors of the high voltage power supply and the machine frame. Thus, the leakage resistances between the conductors of the high voltage power supply and the frame are normally very high. However, under faulty conditions (e.g., insulation failure), electric currents from a high voltage power supply may leak to a machine frame. Such leakage currents, when significant, may be an indication of machine component fatigue or failure of a conductor's insulation. In order to ensure the proper operating conditions and the integrity of the machines, it is necessary to detect electrical leakage between the conductors of the high voltage power supply and the machine frame. High voltage systems typically include a ground fault detection system to ensure proper operating conditions.

Since ground fault detection systems are essential for protecting equipment, proper testing of the detection systems is crucial. Typically, specialized personnel (not a machine operator) test ground fault detection systems of a machine as part of a scheduled maintenance plan. This testing involves connecting external testing units directly to the ground fault detection system of a machine and simulating an electrical leakage. There are two significant problems with this testing regime. First, the testing method requires the machine to be out-of-service even if no fault is found with the ground fault detection system. More significantly, the ground fault system may not be functioning correctly for an extended period (between service intervals), which may increase the occurrence of a machine malfunctioning without an alarm. A second problem is that operators lack a field method, test equipment, and specialized training for quickly and efficiently ensuring proper operating conditions. For example, if operators observe an actual field condition that they believe might compromise the ground detection system (e.g. the insulation is cracked on an electrical connector), the operators must either incur a costly delay waiting to have the machine serviced or effect repairs themselves, possibly insufficiently.

One grounding system test apparatus is disclosed in U.S. Pat. No. 4,609,865 (the '865 patent) issued to Goodman et al. on Sep. 2, 1986. The '865 patent discloses an apparatus that is mounted in or alongside a conventional power center or distribution box in a power system located in a coal mine or similar location. The apparatus introduces a test current into the power system. The apparatus includes a means for adjusting the test current through an adjustable resistor to a predetermined value to check the tripping values of ground fault relays.

Though introducing an actual leakage into a power system to verify actual operation of a ground fault detection system, the '865 patent fails to provide a quick and efficient method for individual operators to instantaneously check the operating condition of machines. The '865 patent also fails to provide a testing method that is applicable at both a low operating voltage and a high operating voltage.

The testing system and method of the present disclosure solve one or more of the problems set forth above.

SUMMARY OF THE DISCLOSURE

In one exemplary aspect, the present disclosure is directed to a testing system for a ground fault detection system of an electrical system of a machine. The testing system includes a low voltage power source, the low voltage power source capable of operation that is independent from a high voltage power source of the machine. The testing system also includes a variable current source that is permanently connected to a positive voltage bus or to a negative voltage bus of the electrical system of the machine, where the machine operates self-sufficiently. The testing system further includes a controller connected to the variable current source. The testing system also has an input device, where the input device is connected to the controller.

In another aspect, the present disclosure is directed to a method for testing a ground fault detection system of an electrical system of a machine. The method includes providing a low voltage power source, the low voltage power source capable of operation that is independent from a high voltage power source of the machine. The method also includes permanently connecting a variable current source to a positive voltage bus or to a negative voltage bus of the electrical system of the machine, where the machine operates self-sufficiently. The method further includes connecting a controller to the variable current source and connecting an input device to the controller. The method also includes inducing an actual leakage current in the machine and triggering the ground fault detector system.

BRIEF DESCRIPTION OF THE DRAWINGS

FIGURE is a schematic illustration of an electrical system and an exemplary disclosed testing system for a ground fault detection system of the electrical system.

DETAILED DESCRIPTION

An exemplary embodiment of an electrical system 100 is illustrated in FIGURE Electrical system 100 may be for a vehicle or other machine (not shown) that operates self-sufficiently and independently of other machines and power sources. In the disclosed embodiments, a machine may refer to a petroleum-electric hybrid powered machine, such as a hybrid-electric vehicle which uses an internal combustion engine and electric batteries, fuel cells, or other electrical power sources to power electric motors. A machine may also refer to any type of machine, such as an electric vehicle, with one or more electric motors and an electric power source. A frame may refer to the conductive support structure or housing of the machine, including an electrical power source.

Electrical system 100 may include a high voltage power supply V. High voltage power supply V may be a generator, a battery, or any other suitable power source. In one embodiment, high voltage power supply V may be a high voltage DC power supply, such as an 800 volt DC power supply. A positive voltage bus HV+ is connected to the positive terminal of high voltage power supply V. A negative voltage bus HV− is connected to the negative terminal of high voltage power supply V.

Electrical system 100 may also include voltage dividers (not shown) and sensor circuits (not shown). Resistors R1 and R2 represent the equivalent resistance of the voltage dividers and sensor circuits of electrical system 100. The positive and negative voltage buses (HV+ and HV−) are resistively referenced to a frame ground 110 by resistors R1 and R2. When electrical system 100 is balanced (e.g., in a balanced condition), the positive and negative voltage buses (HV+ and HV−) are centered equally around frame ground 110. When electrical system 100 is unbalanced (or in an unbalanced condition), the positive and negative voltage buses (HV+ and HV−) are not centered around frame ground 110.

Electrical system 100 may further include capacitors C1 and C2. Capacitors C1 and C2 may be any suitable type of capacitor known in the art, such as metal capacitors. Capacitors C1 and C2 may serve the purpose of smoothing a pulse-width modulation signal that may be introduced into electrical system 100. Capacitors C1 and C2 may represent the equivalent capacitance of electrical system 100 and power source V.

Electrical system 100 may also include a low voltage power source LV and two associated resistors R3 and R4. Low voltage power source LV may be a generator, a battery, or any other suitable power source. Low voltage power source LV may operate independently of high voltage power source V. Resistors R3 and R4 may be any suitable type of resistor known in the art, such as a metal film resistor or a wirewound resistor. Low voltage power source LV may be resistively referenced to frame ground 110 by resistors R3 and R4 causing an LV balanced condition.

When electrical system 100 is balanced, low voltage power source LV may be centered around frame ground 110. For example, low voltage power source LV may be a 40 volt power supply. When electrical system 100 is balanced, positive voltage bus HV+ may be +20 volts and negative voltage bus HV− may be −20 volts. When electrical system 100 is unbalanced (or in an unbalanced condition), low voltage power source LV will not be centered around frame ground 110. In this unbalanced condition, positive voltage bus HV+ may be +30 volts and negative voltage bus HV− may be −10 volts, making the system unbalanced with respect to frame ground 110.

Electrical system 100 may also include diodes D1 and D2. Diodes D1 and D2 may be any suitable diode known in the art, such as diodes made from metal or semiconductor material. Diodes D1 and D2 may restrict the flow of current within electrical system 100, and may serve to isolate low voltage power source LV from high voltage power source V.

Electrical system 100 may also include a ground fault detector detection system 145. The ground fault detection system 145 may be a system known in the art for sensing the unbalanced condition of electrical system 100. The ground fault detection system 145 may include alarms for alerting operators. The alarms may activate at predetermined thresholds corresponding to unbalanced conditions or leakage currents posing potential harm to equipment.

Electrical system 100 may include an undesired leakage current through R_leak. Leakage current through R_leak may be caused by some fault in the materials or structure of electrical system 100, such as an insulation failure. When the resistance (R_leak) is very high, such as 1000 M ohms, there may be only a negligible amount of current leakage in electrical system 100. In this condition, electrical system 100 may remain in a balanced condition. However, the resistance against leakage current (R_leak) may decrease due to component deterioration in the system. As the fault worsens, the resistance against leakage current (R_leak) may decrease and leakage current may increase. As leakage current increases, electrical system 100 may become increasingly unbalanced, creating a condition that may cause equipment to malfunction. A maintenance goal for electrical system 100 may be to keep the value of undesired leakage current R_leak to a negligible level.

Electrical system 100 may include a variable current source 120. Variable current source 120 may be permanently fixed to the positive voltage bus HV+ or the negative voltage bus HV− of electrical system 100. Variable current source 120 may include a resistor R_comp and a pulse width modulated switch (i.e. a variable duty cycle switch) Q1. Varying the duty cycle of switch Q1 may effectively turn R_comp into a variable resistor, because the effective resistance of R_comp is proportional to the duty cycle of switch Q1 causing a variable current. Variable current source 120 essentially provides a way for an operator to create an actual leakage current, through R_comp, in electrical system 100. For example, if switch Q1 is pulsed with a 50% duty cycle control signal, R_comp will effectively be 1/0.5 (2 times) larger than its actual fixed resistance value.

Electrical system 100 may include a controller 140. Controller 140 may be any type of programmable logic controller known in the art for automating machine processes. Controller 140 may be made from any material known in the art for logic devices, and may include a microprocessor, program memory, and pulse width modulation components. Controller 140 may include input/output arrangements that allow it to be connected to variable current source 120 and an input device 160. An electrical line 130 may connect variable current source 120 to controller 140. Electrical line 150 may connect controller 140 to input device 160. An electrical line (not shown) may also connect controller 140 to low voltage power source LV.

Input device 160 may be located at an operator's station (not shown) of the machine. Input device 160 may be a plastic or metal button. Input device 160 may also be a touch screen. The touch screen may be any suitable digital display device known in the art for receiving input. The touch screen may receive input when an operator presses the digital display device. The input device 160 or controller 140 may be automated to perform a test function by a timed sequence or commanded remotely by data link signal from another machine controller or an electronic service/diagnostic tool.

INDUSTRIAL APPLICABILITY

The disclosed testing system may provide a quick and efficient method for individual operators to verify that the electrical system of machines or vehicles with which they work are operating properly. Operators may instantaneously verify proper operating conditions of machines and vehicles, instead of having to wait on specialized personnel to test them. The disclosed test method may also verify the proper operating condition of a machine at both a low operating voltage (e.g. during operator checks prior to operation) and at a high operating voltage (e.g. during normal machine operation).

An operator may perform the disclosed testing method at a low operating voltage. Testing under low operating voltage conditions may be appropriate during servicing of electrical system 100 after a fault has been detected and has to be located and repaired. These low voltage checks may occur prior to activation of high voltage power source V by the operator. An operator may provide input to controller 140 through input device 160. Controller 140 may send output to low voltage power source LV, activating power source LV. Controller 140 may be activated remotely by a service/diagnostic tool.

An operator may then provide input to controller 140, through input device 160, to activate variable current source 120. Through input device 160, the operator may select any magnitude of leakage current. Since this magnitude of current is directly proportional to the magnitude of resistance of R_comp and voltage, the operator may effectively induce any magnitude of leakage current into electrical system 100. The operator may use input device 160 to select a leakage current corresponding to the exact leakage current at which an alarm of the ground fault detection system 145 of electrical system 100 should activate. The operator may initiate an automated test sequence with predetermined leakage currents and alarm thresholds.

Based on the operator's input, R_comp may induce a leakage current that will create an unbalanced condition in electrical system 100. The operator may observe whether the ground fault detection system 145 activates an alarm at the selected threshold. If the alarm activates at the proper threshold, then the operator has verified the response of the ground fault detection system to a real leakage current in the actual machine. If the alarm of the ground fault detection system 145 fails to activate at the appropriate unbalanced condition, then the operator will know that the ground fault detection system 145 is not operating properly or a balanced fault may exist. The operator may conduct any number of instantaneous tests, selecting various magnitudes of leakage current and test duration.

An operator may also perform the disclosed testing method at a high operating voltage, while the high voltage power source V is operating. The operator may perform the same method described above for low operating voltage, except that it is not necessary to activate the low voltage power source LV.

The disclosed testing method may be partially automated or completely automated. In one embodiment, activating input device 160 may be a single step, after which controller 140 completes an automated procedure for checking the ground fault detection system 145 at various pre-determined thresholds. In this embodiment, an operator may make a single input and receive a single output (e.g. "functioning" or "malfunctioning"). In another embodiment, the disclosed testing method may allow the operator latitude in selecting from a broad range of leakage currents and running numerous tests.

The disclosed testing method may provide an instantaneous verification for individual operators that electrical system 100 of their machines or vehicles are operating properly. Instead of having to wait for specialized maintenance personnel to verify the operation of the ground fault detection system 145 of electrical system 100, operators may immediately test the system. The disclosed testing method may prevent a delay of time and waste of labor caused by waiting for specialized maintenance personnel to arrive. Additionally, the disclosed testing method may run continuously while the machine is being operated normally.

The disclosed testing method may also verify the proper operating condition of a machine at both a low and high operating voltage, allowing the operator to save time while ensuring proper conditions. If a machine is operating, the operator may immediately ensure proper conditions at a high voltage, without having to interrupt work to stop the machine and conduct testing. The operator may also immediately check proper conditions at low voltage during servicing, or prior to activating high voltage power source V of the machine.

It will be apparent to those skilled in the art that various modifications and variations can be made to the disclosed testing method. Other embodiments will be apparent to those skilled in the art from consideration of the specification and practice of the disclosed method and apparatus. It is intended that the specification and examples be considered as exemplary only, with a true scope being indicated by the following claims.

What is claimed is:

1. A testing system for a ground fault detection system of an electrical system of a machine, comprising:
a low voltage power source, the low voltage power source capable of operation that is independent from a high voltage power source of the machine;
a variable current source that is permanently connected to a positive voltage bus or to a negative voltage bus of the electrical system of the machine, the variable current source being connected directly to ground, where the machine operates self-sufficiently;
a controller connected to the variable current source; and
an input device, where the input device is connected to the controller.

2. The testing system of claim 1, wherein the variable current source includes a resistor.

3. The testing system of claim 1, wherein the variable current source includes a variable duty cycle switch.

4. The testing system of claim 1, wherein the input device is a button.

5. The testing system of claim 1, wherein the input device is located remotely from the controller and connected to the controller by a data link.

6. The testing system of claim 5, wherein the input device is a service tool.

7. The testing system of claim 1, wherein the input device is a touch screen.

8. The testing system of claim 1, wherein the machine is a vehicle.

9. A method for testing a ground fault detection system of an electrical system of a machine, the machine including a low voltage power source that is capable of operation that is independent from a high voltage power source of the machine, the machine having a variable current source connected to a positive voltage bus or to a negative voltage bus of the electrical system of the machine, the variable current source being connected to a controller, the controller being connected to an input device, the method comprising:
varying the variable current source with the controller through various magnitudes of leakage current during operation of the variable current source; and
triggering the ground fault detector system.

10. The method of claim 9, wherein the variable current source includes a resistor.

11. The method of claim 9, wherein the variable current source includes a variable duty cycle switch.

12. The method of claim 9, wherein the input device is a button.

13. The method of claim 9, wherein the input device is located remotely from the controller and connected to the controller by a data link.

14. The method of claim 13, wherein the input device is a service tool.

15. The method of claim 9, wherein the input device is a touch screen.

16. The method of claim 9, wherein the machine is a vehicle.

17. An electrical system of a machine, comprising an electrical system;
- a ground fault detection system for the electrical system; and
- a testing system for the ground fault detection system, including:
  - a low voltage power source, the low voltage power source capable of operation that is independent from a high voltage power source of the machine;
  - a variable current source that is permanently connected to a positive voltage bus or to a negative voltage bus of the electrical system of the machine, where the machine operates self-sufficiently, the variable current source being connected directly to ground;
  - a controller connected to the variable current source; and
  - an input device, where the input device is connected to the controller.

18. The electrical system of claim 17, wherein the variable current source includes a resistor and a variable duty cycle switch.

19. The electrical system of claim 17, wherein the input device is a button or a touch screen.

20. The electrical system of claim 17, wherein the machine is a vehicle.

* * * * *